United States Patent [19]

Hollstein et al.

[11] Patent Number: 5,101,154
[45] Date of Patent: Mar. 31, 1992

[54] OPEN BOND DETECTOR FOR AN INTEGRATED CIRCUIT

[75] Inventors: Roger L. Hollstein, Phoenix; M. Nghiem Phan, Mesa, both of Ariz.

[73] Assignee: Motorola, Inc., Schaumburg, Ill.

[21] Appl. No.: 612,175

[22] Filed: Nov. 13, 1990

[51] Int. Cl.⁵ .................... G01R 31/01; G01R 31/02
[52] U.S. Cl. ................ 324/158 R; 324/73.1; 324/537
[58] Field of Search ............ 324/158 R, 158 F, 73.1, 324/537, 500, 66, 538; 340/650, 651, 652; 371/15.1, 16.1, 25.1; 307/303, 301; 437/8

[56] References Cited

U.S. PATENT DOCUMENTS

| | | | |
|---|---|---|---|
| 3,577,070 | 5/1971 | Whitekettle, Jr. | 324/538 |
| 3,801,905 | 2/1974 | Baker et al. | 324/537 |
| 4,326,162 | 4/1982 | Hankey | 324/538 |
| 4,578,637 | 3/1986 | Allen et al. | 324/537 |
| 4,612,453 | 9/1986 | Yamazaki | 340/652 |
| 4,725,773 | 2/1988 | Lieneweg | 324/158 R |
| 4,779,041 | 10/1988 | Williamson, Jr. | 324/537 |
| 4,783,719 | 11/1988 | Jamison et al. | 324/537 |
| 4,801,869 | 1/1989 | Sprogis | 324/158 R |
| 4,812,742 | 3/1989 | Abel jet al. | 324/538 |

Primary Examiner—Kenneth A. Wieder
Assistant Examiner—Vinh P. Nguyen
Attorney, Agent, or Firm—Robert D. Atkins; Michael D. Bingham

[57] ABSTRACT

An open bond detection circuit is provided for verifying the continuity through a bonding wire connected between an external pin and a bonding pad of an integrated circuit by monitoring the potential developed across a metal conductor connected between the bonding pad and the power supply conductor. An output signal is provided having a first state upon detecting substantially zero potential difference across the metal conductor and a second state when detecting a non-zero potential difference across the metal conductor. The first state of the output signal with substantially zero potential difference reflects an open bond between the external pin and bonding pad, while the second state of the output signal with non-zero potential difference indicates the bonding wire is intact.

16 Claims, 3 Drawing Sheets

OPEN BOND DETECTOR FOR AN INTEGRATED CIRCUIT

FIELD OF THE INVENTION

This invention relates in general to an open bond detection circuit for verifying the continuity through the bonding wires of an integrated circuit.

BACKGROUND OF THE INVENTION

The testing of integrated circuits is an important part of the manufacturing process for ensuring customer satisfaction of the final product. Many testing techniques are available, such as the standardized testing procedures approved through the Joint Test Action Group (JTAG), for checking the functionality and operation of the integrated circuit.

One feature of the integrated circuit which has proven difficult to test is the electrical continuity through the power supply bonding wires. The bonding wire is typically coupled in a path from the external package pin of the integrated circuit to a bonding pad which continues through a metal conductor to the internal power supply conductor. In most integrated circuits, especially those having a high power consumption, the internal power supply conductor receives the external power supply potential through a plurality of parallel conduction paths, each path including the aforedescribed bonding wire, bonding pad and metal conductor for distributing the current flowing therethrough. This is necessary since conventional bonding wires have relatively low current carrying capacity. Thus, one important test during manufacturing is to verify the continuity through all bonding wires to ensure an even distribution of the power supply current as designed. Should the integrated circuit be placed in service with one or more bonding wire missing or broken, the power supply current would be distributed between the remaining bonding wires thereby increasing the stress thereon. Alternately, one or more bonding wires may fail during service which would also cause undesirable stress on the remaining bonding wires. The integrated circuit may not provide optimal performance or may have a reduced service life with the remaining power supply bonding wires carrying excess current.

Conventional testing procedure might suggest simply checking the power supply potential on either side of the bonding wires, or a check continuity between the external power supply pin and the internal power supply conductor. However since both sides are bussed together, any one good connection within the plurality of bonding wires would pass such tests even with an open circuit for one or more of the other bonding wires. Thus, most if not all testing techniques for power supply bonding connections cannot detect a failure of one bonding wire within a plurality of good bonding wires. Moreover, it is difficult to detect bonding wire failures occurring after the integrated circuit is place in service.

Hence, what is needed is an improved integrated circuit having an open bond detection circuit for verifying the continuity through each and every bonding wire coupled between the external pin and the bonding pad either during manufacturing test or any time thereafter even with the integrated circuit mounted on a printed circuit board.

SUMMARY OF THE INVENTION

Briefly stated, the invention comprises an open bond detection circuit including a bonding pad coupled for receiving a power supply potential through a bonding wire, a power supply conductor for routing the power supply potential throughout the integrated circuit and a metal conductor coupled between the bonding pad and the power supply conductor for conducting current and developing a potential difference thereacross. A circuit includes a first terminal coupled to the bonding pad and a second terminal coupled to the power supply conductor for detecting the potential difference across the metal conductor. The circuit provides an output signal having a first state upon detecting a first potential difference across the metal conductor. The output signal of the circuit has a second state when detecting a second potential difference across the metal conductor.

In another aspect, the present invention is a method of detecting continuity between an external pin and a bonding pad of an integrated circuit, wherein the integrated circuit further includes a bonding wire coupled between the external pin and the bonding pad and a metal conductor coupled between the bonding pad and a power supply conductor. The potentials developed at the bonding pad and the power supply conductor are monitored for providing an output signal having a first state upon detecting a first potential difference across the metal conductor and a second state upon detecting a second potential difference across the metal conductor.

The open bond detection circuit of the present invention verifies the continuity through the bonding wires of an integrated circuit. If one or more of bonding wires are open, an output signal of the open bond detection circuit changes state indicating a failure. The open bond detection circuit is especially useful when the integrated circuit is mounted on a printed circuit board possibly operating in service. Thus, the output signal of the open bond detection circuit may be monitored for detecting a bonding wire failure throughout the service life of the integrated circuit.

DETAILED DESCRIPTION OF THE PREFERRED EMBODIMENT

Figure 1:
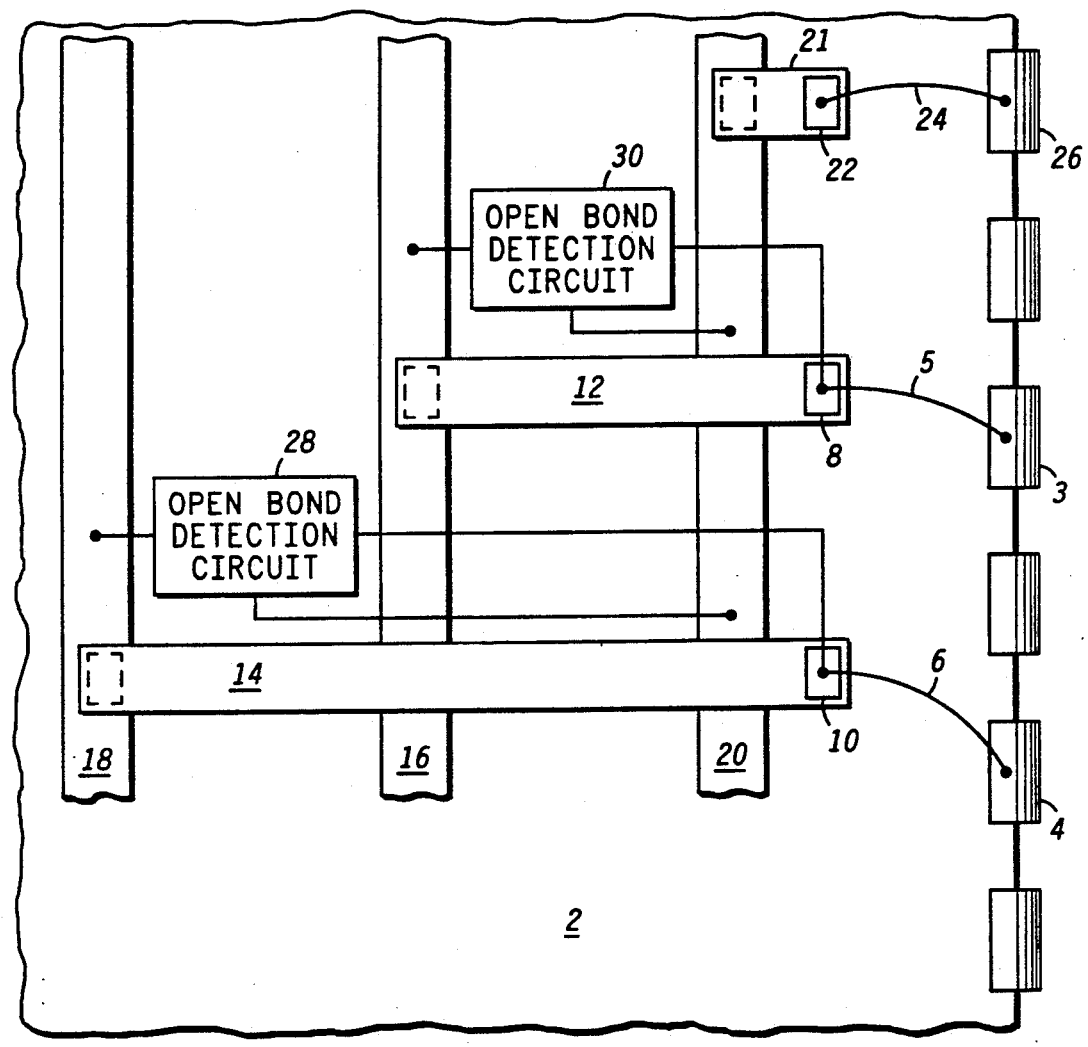
FIG. 1 is an illustration of the interconnection between the bonding wires, bonding pads, metal conductors and internal power supply conductors of an integrated circuit.

Referring to FIG. 1, there is shown a portion of integrated circuit 2 including external pins 3 and 4 coupled through bonding wires 5 and 6, respectively, to bonding pads 8 and 10 which continues through metal conductors 12 and 14 to internal power supply conductors 16 and 18. An external negative power supply potential, such as −5.2 volts, is applied at pin 4 and routed through bonding wire 6, bonding pad 10 and metal conductor 14 to power supply conductor 18 for providing the negative power supply potential throughout integrated circuit 2. Likewise, an positive power supply potential, such as zero volts, is applied at pin 3 and routed through bonding wire 5, bonding pad 8 and metal conductor 12 to power supply conductor 16 for providing the positive power supply potential throughout integrated circuit 2. Typically, internal power supply conductor 18 receives the negative power supply potential through a plurality of conduction paths (not shown) such as the path through bonding wire 6, bonding pad 10 and metal conductor 14 for distributing the current flowing therethrough. Internal power supply conductor 16 may also receive the positive power supply potential through a plurality of conduction paths (not shown) such as the path through bonding wire 5, bonding pad 8 and metal conductor 12 for distributing the current flow.

The connections through bonding wires 5 and 6 and metal conductors 12 and 14 to internal power supply conductors 16 and 18, respectively, are conventional in modern integrated circuits. As part of the present invention, open bond detection conductor 20 is disposed on integrated circuit 2 and coupled through metal conductor 21, bonding pad 22 and bonding wire 24 to open bond detection pin 26. Furthermore, open bond detection circuit 28 is provided including a first terminal coupled to bonding pad 10 and a second terminal coupled to power supply conductor 18 for providing an output signal at open bond detection conductor 20. In a similar manner, open bond detection circuit 30 includes a first terminal coupled to bonding pad 8 and a second terminal coupled to internal power supply conductor 16 also having an output coupled to open bond detection conductor 20. An open bond detection circuit like 28 is provided for each of the plurality of conduction paths between pin 4 and power supply conductor 18 such as provided through bonding wire 6, bonding pad 10 and metal conductor 14. Moreover, an open bond detection circuit like 30 is provided for each of the plurality of conduction paths between pin 3 and power supply conductor 16 such as provided through bonding wire 5, bonding pad 8 and metal conductor 12. Should one or more of the power supply bonding wires like 5 and 6 be missing or loose continuity, open bond detection circuit 28 or 30, or both will flag such a condition by developing an appropriate output signal through open bond detection conductor 20 to open bond detection pin 26.

Figure 2:
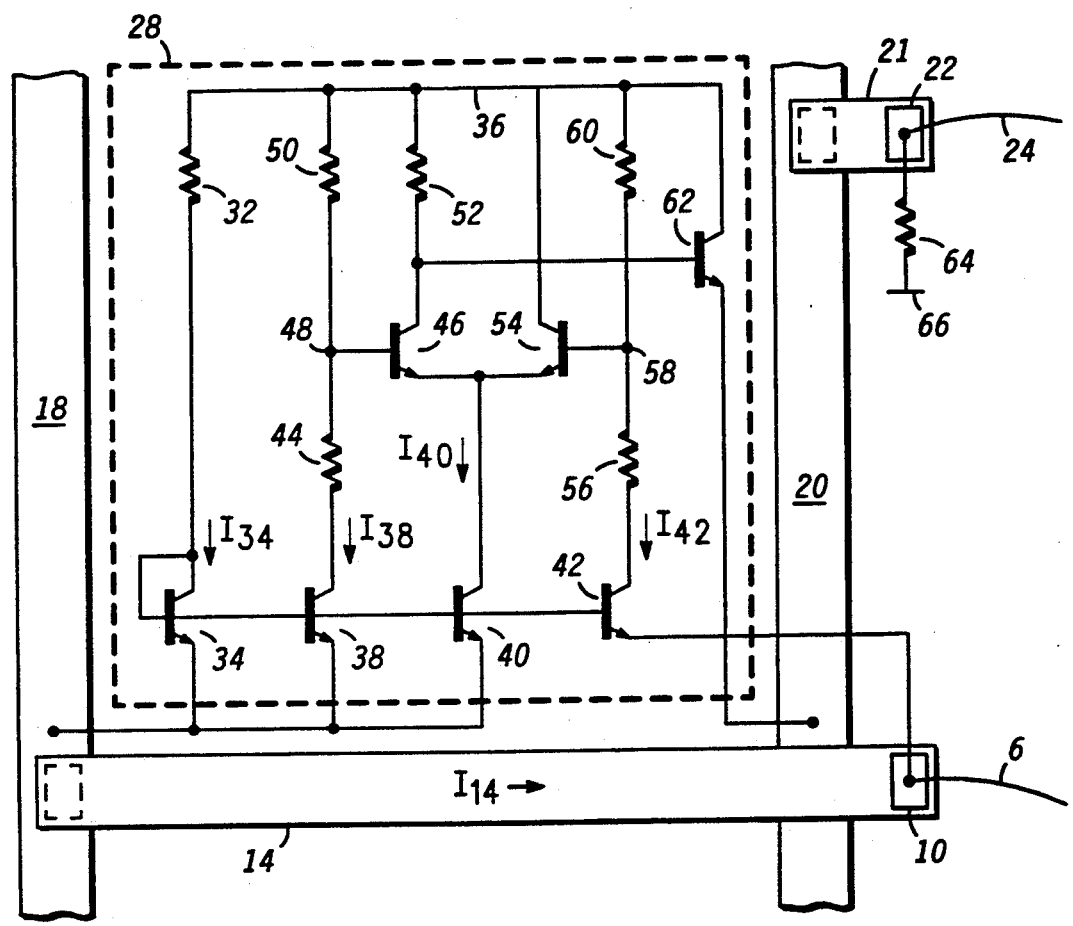
FIG. 2 is a schematic diagram illustrating the preferred embodiment of the present invention for a negative power supply bonding wire.

Accordingly, open bond detection circuit 28 for negative power supply conductors is illustrated in greater detail in FIG. 2 including resistor 32 coupled between the collector of diode-configured transistor 34 and power supply conductor 36 operating at zero volts or a positive potential. The collector and base of transistor 34 are coupled together, while the emmitter of the same is coupled to negative power supply conductor 18. The base of transistor 34 is also coupled to the bases of transistors 38,40 and 42 for providing a reference potential thereto, while the emitters of transistors 38 and 40 are coupled to power supply conductor 18 and the emitter of transistor 42 is coupled to negative power supply bonding pad 10. The collector of transistor 38 is coupled through resistor 44 to the base of transistor 46 at node 48, and continuing through resistor 50 to power supply conductor 36. The collector of transistor 46 is coupled through resistor 52 to power supply conductor 36, and the emitter of transistor 46 is coupled to the collector of transistor 40 and to the emitter of transistor 54. The collector of transistor 42 is coupled through resistor 56 to the base of transistor 54 at node 58, while the collector and base of transistor 54 are coupled to power supply conductor 36, the latter path including resistor 60. Transistors 46 and 54 are differentially configured with a tail current source formed by transistor 40 operating in response to the potentials developed at node 48 and 58. The collector of transistor 46 is also coupled to the base of transistor 62 which includes a collector coupled to power supply conductor 36 and an emitter coupled to open bond detection conductor 20 for providing the output signal of open bond detection circuit 28 thereto. Resistor 64 is coupled between bonding pad 22 and power supply conductor 66 typically operating at a negative potential such as $-5.2$ volts. Components having a similar function are given the same reference number used in FIG. 1.

The operation of open bond detection circuit 28 proceeds as follows. First consider the case where bonding wire 6 is intact providing continuity between pin 4 and bonding pad 10. A current $I_{14}$ flows through bonding wire 6 and metal conductor 14 as shown establishing a potential difference thereacross such that the potential at the emitters of transistors 34,38 and 40 is more positive than that at the emitter of transistor 42. Furthermore, a current $I_{34}$ flows through resistor 32 and diode-configured transistor 34 establishing a predetermined reference potential at the bases of transistors 38,40 and 42. There is a non-zero potential difference developed between bonding pad 10 and power supply conductor 18 such that the base-emitter junction potential ($V_{be}$) of transistor 42 is greater than the $V_{be}$'s of transistors 34, 38 and 40, and the current $I_{42}$ flowing through transistor 42 is greater than the currents $I_{38}$ and $I_{40}$ flowing through transistors 38 and 40, respectively. The values of resistors 44,50,56 and 60 are selected at say 20K, 50K, 20K and 48K ohms, respectively, whereby the larger current $I_{42}$ reduces the potential at node 58 as compared to the potential developed at node 48 because of the differential configuration, turning off transistor 54 and turning on transistor 46 for conducting current $I_{40}$. The collector potential of transistor 46 is pulled low through transistors 40 and 46 thereby turning off transistor 62 and allowing resistor 64 to pull bonding pad 22 low. Thus, a low output signal is developed at open bond detection pin 26 indicating continuity through bonding wire 6. Integrated circuit 2 typically includes many open bond detection circuits like 28, one for each combination of bonding wire like 6, bonding pad like 10 and metal conductor like 14. The output signal at open bond detection pin 26 remains low provided each transistor like 62 of open bond detection circuits like 28 is non-conductive which occurs when a current $I_{14}$ flows through each and every negative power supply bonding wire like 6 developing a non-zero potential across metal conductor like 14.

Now consider the case where bonding wire 6 is missing or broken such that no current flows through metal conductor 14. The potential at the emitter of transistor 42 is equal to the potential at the emitters of transistors 34, 38 and 40 by nature of the common node provided by metal conductor 14 between power supply conductor 18 and bonding pad 10. Hence, there is substantially zero potential difference between bonding pad 10 and power supply conductor 18. The $V_{be}$'s of transistors 34,38,40 and 42 are thus equal and the current $I_{42}$ flowing through transistor 42 is equal to the current $I_{38}$ flowing through transistors 38. Resistors 44, 50, 56 and 60 are also selected such that a lower potential is developed at node 48 as compared to node 58 with equal currents $I_{38}$ and $I_{42}$. The low signal at node 48 turns off transistor 46 and turns on transistor 54 for conducting the current flowing through transistor 40. The collector potential of transistor 46 is pulled high through resistor 52, turning on transistor 62 and developing a high output signal at bonding pad 22 as current flows through transistor 62 into resistor 64. Thus, a high output signal at open bond detection pin 26 indicates an open circuit through bonding wire 6. Indeed, since the open bond detection circuits operate independent of each other and the output signals thereof are wire-ored to open bond detection conductor 20, any one of the open bond detection circuits like 28 may detect a loss of continuity through corresponding bonding wire like 6 and provide a high output signal at open bond detection pin 26.

The state of the output signal of open bond detection circuit 28 is applicable both in manufacturing test and during service while integrated circuit 2 is mounted on a printed circuit board. For example, open bond detection pin 26 may be monitored by an external microprocessor while in service and upon detecting a high output signal thereof notify the operator of a power supply bond failure.

Figure 3:
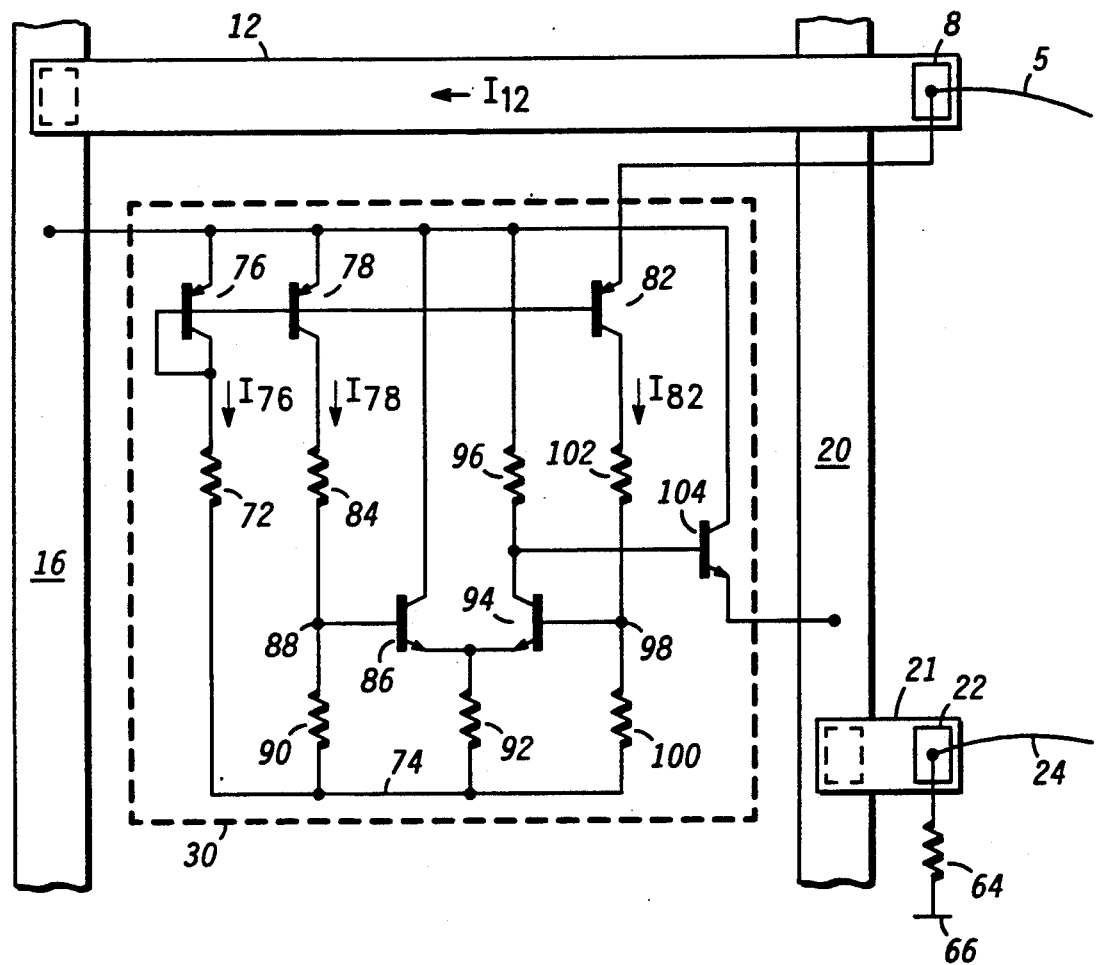
FIG. 3 is a schematic diagram illustrating the preferred embodiment of the present invention for a positive power supply bonding wire.

Turning to FIG. 3, open bond detection circuit 30 for positive power supply conductors is shown with resistor 72 coupled between power supply conductor 74 operating at a negative potential such as $-5.2$ volts and the collector of diode-configured transistor 76. The collector and base of transistor 76 are coupled together, while the emitter of the same is coupled to positive power supply conductor 16. The base of transistor 76 is also coupled to the bases of the transistor 78 and 82 for providing a reference potential thereto, while the emitter of transistor 78 is coupled to power supply conductor 16 and the emitter of transistor 82 is coupled to positive power supply bonding pad 8. The collector of transistor 78 is coupled through resistor 84 to the base of transistor 86 at node 88 and continuing through resistor 90 to power supply conductor 74. The emitter of transistor 86 is coupled through resistor 92 to power supply conductor 74 and to the emitter of transistor 94, and the collector of transistor 86 is coupled to the power supply conductor 16. The collector of transistor 94 is coupled through resistor 96 to power supply conductor 16, while the base of transistor 94 that is node 98 is coupled through resistor 100 to power supply conductor 74 and through resistor 102 to the collector of transistor 82. The collector of transistor 94 is also coupled to the base of transistor 104 which includes a collector coupled to power supply conductor 16 and an emitter coupled to open bond detection conductor 20 for providing the output signal of open bond detection circuit 30. Components having a similar function are given the same reference number used in FIGs. 1 and 2.

The operation of open bond detection circuit 30 proceeds as follows. Again first consider the case where bonding wire 5 is intact providing continuity between pin 3 and bonding pad 8. A current $I_{12}$ flows through bonding wire 5 and metal conductor 12 as shown establishing a potential difference thereacross such that the potential at the emitters of transistors 76 and 78 is more negative than that at the emitter of transistor 82. Furthermore, a current $I_{76}$ flows through resistor 72 and diode-configured transistor 76 establishing a predetermined reference potential at the bases of transistors 78 and 82. Thus, there is a non-zero potential difference between bonding pad 8 and power supply conductor 16 such that the $V_{be}$ of transistor 82 is greater than the $V_{be}$'s of transistors 76 and 78, and the current $I_{82}$ flowing through transistor 82 is greater than the current $I_{78}$ flowing through transistor 78. The values of resistors 84, 90, 100 and 102 are selected at say 20K, 50K, 48K and 20K ohms, respectively, whereby the larger current $I_{82}$ increases the potential developed across resistor 100 at node 98 with respect to the potential developed at node 88, turning on transistor 94 and turning off transistor 86. The collector potential of transistor 94 is pulled low through transistor 94 thereby turning off transistor 104 and allowing resistor 64 to pull bonding pad 22 low. Thus, a low output signal is developed at open bond detection pin 26 indicating continuity through bonding wire 5. Integrated circuit 2 typically includes many open bond detection circuits like 30 one for each combination of bonding wire like 5, bonding pad 8 and metal conductor like 12. The output signal at open bond detection pin 26 remains low provided each transistor like 104 of open bond detection circuits like 30 is non-conductive which occurs when a current $I_{12}$ flows through each and every positive power supply bonding wire like 5 developing a non-zero potential across metal conductor like 12.

When bonding wire 5 is missing or broken, the potential at the emitter of transistor 82 is equal to the potential at the emitters of transistors 76 and 78 due to the common node provided by metal conductor 12 between power supply conductor 16 and bonding pad 8. No current flows through metal conductor 12, and there is substantially zero potential difference between bonding pad 8 and power supply conductor 16. The $V_{be}$'s of transistors 76, 78 and 82 are thus equal and the current $I_{82}$ flowing through transistor 82 is equal to the current $I_{78}$ flowing through transistors 78. Resistors 84, 90, 100 and 102 are also selected such that a higher potential is developed at node 88 as compared to node 98 with equal currents $I_{78}$ and $I_{82}$. The high signal at node 88 turns on transistor 86 and turns off transistor 94 for conducting the current flowing through resistor 92. The collector potential of transistor 94 is pulled high through resistor 96, turning on transistor 104 and developing a high output signal through open bond detection conductor 20 to bonding pad 22 as the current from transistor 104 flows into resistor 64. Thus, a high output signal at open bond detection pin 26 indicates an open circuit through bonding wire 5. Any one of the open bond detection circuits like 30 may detect a loss of continuity through corresponding bonding wire like 5 because of the wire-ored connection to open bond detection conductor 20 and provide a high output signal at open bond detection pin 26.

Hence, what has been provided is a novel open bond detection circuit for verifying the continuity through a bonding wire coupled between an external pin and the bonding pad of an integrated circuit, wherein the state of an output signal provided at the output of the open bond detection circuit indicates either continuity or lack thereof for the power supply bonding wire. A open bond detection circuit is provided for each bonding wire while the output signals thereof are wire-ored together whereby one or more open power supply bonds may signal a bonding failure.

We claim:

1. An integrated circuit, comprising:
   a bonding pad coupled for receiving a power supply potential through a bonding wire;
   a power supply conductor for routing said power supply potential throughout the integrated circuit;

a metal conductor coupled between said bonding pad and said power supply conductor for conducting current and developing a potential difference thereacross; and first means having a first terminal coupled to said bonding pad and a second terminal coupled to said power supply conductor for detecting said potential difference across said metal conductor, said first means providing an output signal having a first state upon detecting a first potential difference across said metal conductor, said output signal having a second state when detecting a second potential difference across said metal conductor.

2. The integrated circuit of claim 1 wherein said first means includes:

second means for developing a reference potential;

a first transistor having a collector, a base and an emitter, said emitter being coupled to said power supply conductor, said base being coupled for receiving said reference potential;

a first resistor having a first terminal coupled to said collector of said first transistor and having a second terminal;

a second resistor coupled between said second terminal of said first resistor and a first source of operating potential;

a second transistor having a collector, a base and an emitter, said emitter being coupled to said power supply conductor, said base being coupled for receiving said reference potential;

a third transistor having a collector, a base and an emitter, said emitter being coupled to said collector of said second transistor, said base being coupled to said second terminal of said first resistor, said collector developing said output signal of said first means; and a third resistor coupled between said collector of said third transistor and said first source of operating potential.

3. The integrated circuit of claim 2 wherein said first means further includes:

a fourth transistor having a collector, a base and an emitter, said emitter being coupled to said bonding pad, said base being coupled for receiving said reference potential;

a fourth resistor having a first terminal coupled to said collector of said fourth transistor and having a second terminal;

a fifth resistor coupled between said second terminal of said fourth resistor and said first source of operating potential; and a fifth transistor having a collector, a base and an emitter, said emitter being coupled to said emitter of said third transistor, said base being coupled to said second terminal of said fourth resistor, said collector being coupled to said first source of operating potential.

4. The integrated circuit of claim 3 further including:
a second conductor; and
a sixth transistor having a collector, a base and an emitter, said emitter being coupled to said second conductor, said base being coupled to said collector of said third transistor, said collector being coupled to said first source of operating potential.

5. The integrated circuit of claim 4 wherein said second means includes:

a seventh transistor having a collector, a base and an emitter, said emitter being coupled to said power supply conductor, said base and collector being coupled together for providing said reference potential; and a sixth resistor coupled between said collector of said seventh transistor and said first source of operating potential.

6. The integrated circuit of claim 1 wherein said first means includes:

second means for developing a reference potential;

a first transistor having a collector, a base and an emitter, said emitter being coupled to said bonding pad, said base being coupled for receiving said reference potential;

a first resistor having a first terminal coupled to said collector of said first transistor and having a second terminal;

a second resistor coupled between said second terminal of said first resistor and a first source of operating potential;

a second transistor having a collector, a base and an emitter, said collector developing said output signal of said first means, said base being coupled to said second terminal of said first resistor;

a third resistor coupled between said emitter of said second transistor and said first source of operating potential; and a fourth resistor coupled between said collector of said second transistor and said power supply conductor.

7. The integrated circuit of claim 6 wherein said first means further includes:

a third transistor having a collector, a base and an emitter, said emitter being coupled to said emitter of said second transistor, said collector being coupled to said power supply conductor;

a fourth transistor having a collector, a base and an emitter, said emitter being coupled to said power supply conductor, said base being coupled for receiving said reference potential;

a fifth resistor having a first terminal coupled to said collector of said fourth transistor and having a second terminal coupled to said base of said third transistor; and a sixth resistor coupled between said base of said third transistor and said first source of operating potential.

8. The integrated circuit of claim 7 further including:
a second conductor; and
a fifth transistor having a collector, a base and an emitter, said emitter being coupled to said second conductor, said base being coupled to said collector of said second transistor, said collector being coupled to said power supply conductor.

9. The integrated circuit of claim 8 wherein said second means includes:

a sixth transistor having a collector, a base and an emitter, said emitter being coupled to said power supply conductor, said base and collector being coupled together for providing said reference potential; and a seventh resistor coupled between said collector of said sixth transistor and said first source of operating potential.

10. A method of detecting continuity between an external pin and a bonding pad of an integrated circuit, wherein the integrated circuit further includes a bonding wire coupled between the external pin and the bonding pad and a metal conductor coupled between the bonding pad and a power supply conductor, comprising the steps of:

monitoring the potential developed at the bonding pad;

monitoring the potential developed at the power supply conductor for determining a potential difference across the metal conductor; and providing an output signal having a first state upon detecting a first potential difference across the metal conductor, said output signal having a second state upon detecting a second potential difference across the metal conductor.

11. A circuit for developing an output signal, comprising:

a bonding pad coupled for receiving a power supply potential through a bonding wire;

a power supply conductor for routing said power supply potential throughout the integrated circuit;

a metal conductor coupled between said bonding pad and said power supply conductor for conducting current and developing a potential difference thereacross;

circuit means for developing a reference potential;

a first transistor having a collector, a base and an emitter, said emitter being coupled to said power supply conductor, said base being coupled for receiving said reference potential;

a first resistor having a first terminal coupled to said collector of said first transistor and having a second terminal;

a second resistor coupled between said second terminal of said first resistor and a first source of operating potential;

a second transistor having a collector, a base and an emitter, said emitter being coupled to said power supply conductor, said base being coupled for receiving said reference potential;

a third transistor having a collector, a base and an emitter, said emitter being coupled to said collector of said second transistor, said base being coupled to said second terminal of said first resistor, said collector developing the output signal of the circuit;

a third resistor coupled between said collector of said third transistor and said first source of operating potential;

a fourth transistor having a collector, a base and an emitter, said emitter being coupled to said bonding pad, said base being coupled for receiving said reference potential;

a fourth resistor having a first terminal coupled to said collector of said fourth transistor and having a second terminal;

a fifth resistor coupled between said second terminal of said fourth resistor and said first source of operating potential; and a fifth transistor having a collector, a base and an emitter, said emitter being coupled to said emitter of said third transistor, said base being coupled to said second terminal of said fourth resistor, said collector being coupled to said first source of operating potential.

12. The circuit of claim 11 further including:

a second conductor; and a sixth transistor having a collector, a base and an emitter, said emitter being coupled to said second conductor, said base being coupled to said collector of said third transistor, said collector being coupled to said first source of operating potential.

13. The circuit of claim 12 wherein said circuit means includes:

a seventh transistor having a collector, a base and an emitter, said emitter being coupled to said power supply conductor, said base and collector being coupled together for providing said reference potential; and a sixth resistor coupled between said collector of said seventh transistor and said first source of operating potential.

14. A circuit for developing an output signal, comprising:

a bonding pad coupled for receiving a power supply potential through a bonding wire;

a power supply conductor for routing said power supply potential throughout the integrated circuit;

a metal conductor coupled between said bonding pad and said power supply conductor for conducting current and developing a potential difference thereacross;

circuit means for developing a reference potential;

a first transistor having a collector, a base and an emitter, said emitter being coupled to said bonding pad, said base being coupled for receiving said reference potential;

a first resistor having a first terminal coupled to said collector of said first transistor and having a second terminal;

a second resistor coupled between said second terminal of said first resistor and a first source of operating potential;

a second transistor having a collector, a base and an emitter, said collector developing the output signal of the circuit, said base being coupled to said second terminal of said first resistor;

a third resistor coupled between said emitter of said second transistor and said first source of operating potential;

a fourth resistor coupled between said collector of said second transistor and said power supply conductor;

a third transistor having a collector, a base and an emitter, said emitter being coupled to said emitter of said second transistor, said collector being coupled to said power supply conductor;

a fourth transistor having a collector, a base and an emitter, said emitter being coupled to said power supply conductor, said base being coupled for receiving said reference potential;

a fifth resistor coupled between said collector of said fourth transistor and said base of said third transistor; and a sixth resistor coupled between said base of said third transistor and said first source of operating potential.

15. The circuit of claim 14 further including:

a second conductor; and a fifth transistor having a collector, a base and an emitter, said emitter being coupled to said second conductor, said base being coupled to said collector of said second transistor, said collector being coupled to said power supply conductor.

16. The circuit of claim 15 wherein said circuit means includes:

a sixth transistor having a collector, a base and an emitter, said emitter being coupled to said power supply conductor, said base and collector being coupled together for providing said reference potential; and a seventh resistor coupled between said collector of said sixth transistor and said first source of operating potential.

* * * * *